US007423855B2

(12) United States Patent
Fankhauser et al.

(10) Patent No.: US 7,423,855 B2
(45) Date of Patent: Sep. 9, 2008

(54) ACTIVE PROTECTION CIRCUIT ARRANGEMENT

(75) Inventors: Bernd Fankhauser, Graz (AT); Michael Mayerhofer, Munich (DE)

(73) Assignee: Austriamicrosystems AG, Unterpremstatten (AT)

( * ) Notice: Subject to any disclaimer, the term of this patent is extended or adjusted under 35 U.S.C. 154(b) by 137 days.

(21) Appl. No.: 10/576,104

(22) PCT Filed: Oct. 21, 2004

(86) PCT No.: PCT/EP2004/011925

§ 371 (c)(1), (2), (4) Date: Aug. 1, 2006

(87) PCT Pub. No.: WO2005/041375

PCT Pub. Date: May 6, 2005

(65) Prior Publication Data

US 2007/0146950 A1 Jun. 28, 2007

(30) Foreign Application Priority Data

Oct. 21, 2003 (DE) ................................ 103 49 405

(51) Int. Cl.
*H02H 9/00* (2006.01)

(52) U.S. Cl. ........................................................ 361/56

(58) Field of Classification Search .................... 361/56
See application file for complete search history.

(56) References Cited

U.S. PATENT DOCUMENTS

| | | | | |
|---|---|---|---|---|
| 5,237,395 | A | 8/1993 | Lee | 361/56 |
| 5,455,436 | A | 10/1995 | Cheng | 257/356 |
| 5,559,659 | A | 9/1996 | Strauss | 361/56 |
| 5,617,283 | A | 4/1997 | Krakauer et al. | 361/56 |
| 5,905,288 | A | 5/1999 | Ker | 257/355 |
| 6,118,323 | A | 9/2000 | Chaine et al. | 327/333 |
| 6,229,183 | B1 | 5/2001 | Lee | 257/360 |
| 6,320,230 | B1 | 11/2001 | Yu | 257/355 |
| 6,385,021 | B1 | 5/2002 | Takeda et al. | 361/56 |
| 6,465,768 | B1 | 10/2002 | Ker et al. | 257/355 |
| 6,919,602 | B2 * | 7/2005 | Lin et al. | 257/360 |
| 7,027,275 | B2 * | 4/2006 | Smith | 361/56 |
| 7,116,536 | B2 * | 10/2006 | Jen-Chou | 361/56 |

(Continued)

FOREIGN PATENT DOCUMENTS

CN 11-03121 5/1995

(Continued)

OTHER PUBLICATIONS

English translation of Written Opinion for PCT/EP2004/011925, no date.

(Continued)

*Primary Examiner*—Ronald W Leja
(74) *Attorney, Agent, or Firm*—Fish & Richardson P.C.

(57) ABSTRACT

A circuit arrangement includes an RC element connected between a first supply potential line and a second supply potential line. The RC element includes a first resistor and a first capacitor. The circuit arrangement also includes a plurality of inverters connected in series and having junction points between the inverters in the plurality of inverters. An input of the plurality of inverters is connected to a point between the first resistor and the first capacitor. The circuit arrangement also includes a protection transistor and a plurality of resistors.

13 Claims, 1 Drawing Sheet

U.S. PATENT DOCUMENTS

| | | | | |
|---|---|---|---|---|
| 2002/0130390 | A1 | 9/2002 | Ker et al. .................... | 257/355 |

FOREIGN PATENT DOCUMENTS

| | | |
|---|---|---|
| EP | 0 573 213 | 5/1993 |
| EP | 0 851 552 | 7/1998 |
| EP | 0 723 706 | 5/2000 |
| GB | 2 283 857 | 5/1995 |
| JP | 2003037493 | 2/2003 |
| TW | 449968 | 8/2001 |
| WO | WO02/27795 | 4/2002 |
| WO | WO02/29950 | 4/2002 |

OTHER PUBLICATIONS

English translation of IPER for PCT/EP2004/011925, no date.

Tietze, U et al "Halbleiter-Schaltungstechnik", 1989, Berlin; pp. 164-165, 213-215 ISBN:3-540-19475-4, no month.

* cited by examiner

1
VDD
R1
I1
I2
I3
ST
C1
VSS

10
VDD
R10
R11
I10
I11
I12
ST
C10
R12
R13
VSS

VDD
R10
P10
P11
R11
P12
$C_{DG}$
ST
C10
N10
R12
N11
N12
R13
VSS

ACTIVE PROTECTION CIRCUIT ARRANGEMENT

TECHNICAL FIELD

A circuit arrangement for protecting integrated semiconductor circuits from electrical pulses or electrical overvoltages is disclosed.

Pulses or overvoltages such as these may occur, for example, in the event of so-called electrostatic discharges (ESD). The electrostatic discharges may result in damage to integrated electronic circuits and may even completely destroy them.

BACKGROUND

Active ESD protection circuits for a wide variety of applications are becoming increasingly important, for example in automobile technology. In this case, there is a requirement to also design circuits such as these for considerably higher ESD levels than have hitherto been customary. Active ESD protection circuits are usually triggered by the rise in the ESD signal. In this case, the voltage rise per unit time is detected, and a protection transistor is switched on by means of a drive circuit.

U.S. Pat. No. 6,465,768 discloses an ESD protection means using integrated circuit technology having an n-channel MOS field effect transistor and a parasitic npn bipolar transistor whose collector-emitter path is connected in parallel with the NMOS transistor. In addition, a p-type well having a bias circuit is provided, which bias circuit, in the event of the occurrence of an ESD pulse, triggers a triggering substrate current which, in turn, switches on the parasitic bipolar junction transistor, so that an ESD overvoltage is rapidly discharged at an I/O pin of the circuit. It is often desirable to protect not only a separate I/O pad from the effects of ESD but also the supply line itself.

U.S. Pat. No. 5,559,659 discloses an active protection circuit arrangement comprising an RC element which triggers a downstream inverter chain that drives a protection transistor. In the event of a fault, that is to say when there is an impermissibly high voltage, this overvoltage is discharged to ground by the protection transistor, and downstream subassemblies are thus protected from the high voltage. The transistor can therefore be understood as meaning an actively triggered surge arrester.

SUMMARY

Various problems may occur in ESD circuits. On the one hand, it is undesirable for the protection transistor to be activated when the circuit's voltage is being run up (power-on). This may occur, when the ESD circuit is appropriately designing, for example on account of any steep signal edges of the supply voltage which may occur or else even because the rise time of the voltage on the supply line is not sufficiently slower than the rise time of an ESD pulse. A larger current is then needed during the run-up time in order to switch off the active protection circuit again.

If the ESD circuit responds in an undesirable manner when running up the voltage (power-up) of the circuit, another problem may arise by virtue of the fact that the supply voltage dips in an undesirable manner on account of the protection transistor that has been activated in this way, or at least the rise time is slowed down. As a result, the protection transistor, in turn, has a high impedance and may switch off completely. As can easily be imagined, the subsequent rapid rise in the supply voltage may result in an oscillating or flipflop effect occurring on the supply line. During normal operation, this disadvantageous behavior when switching on the supply voltage may also be triggered by electromagnetic interference that is injected. The oscillating or flipflop effects, in turn, lead to long switch-on times of the integrated circuit, which are undesirable because short switch-on times are an important aspect of the product specification and thus constitute a competitive advantage. The oscillating or flipflop effects also result in the product having poorer EMC capability.

During operation of the circuit, a "ripple", that is to say a short disturbance in the supply voltage, may be judged to be an ESD event and may switch on the protection transistor. As a result, current briefly flows away from the VDD line through the protection transistor, thus rendering the ripple more disruptive. Remedying the situation by externally supporting the supply increases the complexity.

When testing the electromagnetic compatibility (EMC) capability of circuits which are to be protected, EMC test signals may also be used as interference signals. If the protection circuit arrangement reacts too sensitively to these rapid interference signals, the protection circuit may be activated and may trigger renewed running-up of the supply voltage (power-on-reset). This means that EMC characterization is faulty.

In some embodiments, an active protection circuit exhibits a response which is, in contrast, improved.

The invention will be explained in more detail below using exemplary embodiments in conjunction with FIGS. 1 and 2.

DETAILED DESCRIPTION

In the figures, identical elements or elements which have the same effect are provided with the same reference symbols.

Figure 1:
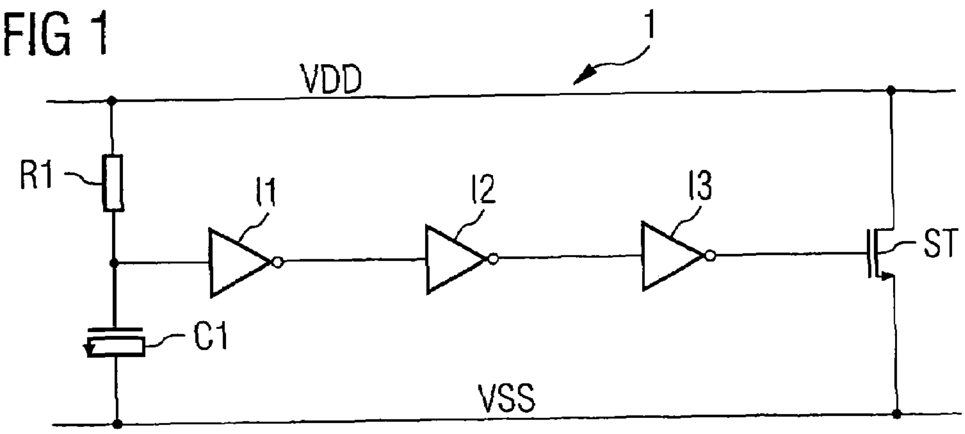
FIG. 1 shows a schematically illustrated protection circuit arrangement (already mentioned) according to the prior art.

As shown in FIG. 1, the known active protection circuit 1 is connected to a line VDD at the supply potential and to a line VSS at the reference ground potential. The supply voltage is thus between VDD and VSS. An input circuit, on the one hand, and/or a useful circuit which is to be protected, on the other hand, may be connected in parallel with this protection circuit, said input circuit and useful circuit not being illustrated in the figure. The input circuit may also simply be a connection (pad) that is connected to VDD.

The resistor R1, together with the capacitor C1, forms an RC element. The resistor R1 is preferably in the form of a diffusion resistance and the capacitor C1 is preferably in the form of an oxide or gate oxide capacitance.

When an ESD pulse or EMC interference occurs, the RC element comprising R1 and C1 triggers a downstream inverter chain comprising the inverters I1, I2 and I3 which are connected in series behind one another. An inverter inverts the signal that is applied to its input and provides the latter at its output. The output of I3 is connected to the control input of a protection transistor ST in such a manner that the inverter can switch on the protection transistor ST in order to discharge the interference signal on the line VDD to reference ground potential VSS. In this case, the number of inverters is matched, inter alia, to the channel type of the protection transistor ST in such a manner that the latter switches on in the event of an ESD pulse or EMC interference. The dimensions of the protection transistor ST are so large that it can discharge the interference signals occurring on VDD.

A rough design rule is that the circuit 1 should be designed in such a manner that the maximum rise time of useful signals on the line VDD, for example the rise in the supply voltage during the switching-on operation, should be approximately a thousand times slower than the rise time of the ESD or EMC pulse.

Figure 2:
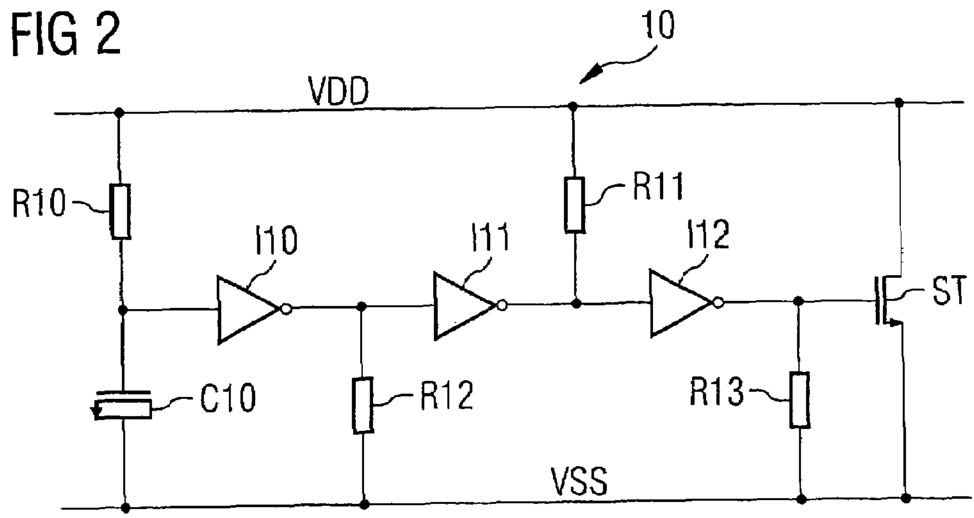
FIG. 2 shows a schematically illustrated protection circuit arrangement having improved properties.

If the problems (mentioned at the outset) of the protection circuit being switched on in an undesirable manner or the problems (mentioned at the outset) of the oscillating or flip-flop effects occur in the case of a circuit as shown in FIG. 1, the circuit may be improved as shown and described in FIG. 2.

The resistor R1, together with the capacitor C1, forms an RC element. The resistor R1 is preferably in the form of a diffusion resistance and the capacitor C1 is preferably in the form of an oxide or gate oxide capacitance.

In some embodiments, the described problems such as the tendency to oscillate and oversensitivity to EMC can be eliminated using pull-up and pull-down resistors which are appropriately dimensioned and are introduced at a suitable point in the above-described ESD protection circuit, in particular the inverter chain. In this case, the pull-up and pull-down resistors are connected to the supply potential and/or reference ground potential. As a result, the switch-on speed of circuits which are protected in this manner may, in turn, be increased for running up the supply voltage.

In the specific exemplary embodiment shown in FIG. 2, this means that the resistor R11 is connected between VDD and the junction point between I11 and I12. On the other hand, the resistor R12 is connected between VSS and the junction point between I10 and I11, while the resistor R13 is connected between VSS and the junction point between I12 and the gate of ST. If R10 is designed to have a resistance of approximately 1 megohm, the resistance values of R11 to R13 are each approximately 5 kilohms in the exemplary embodiment.

It has been found that the pull-up and pull-down resistors R11, R12 and R13 which are arranged as shown in FIG. 2 greatly reduce the described tendency of the circuit shown in FIG. 1 to oscillate or flipover and considerably improve the circuit's EMC capabilities. This means that, in order to operate the circuit 10 safely, the rise time of the voltage supply during power-on now only need be approximately one hundred times slower than the rise time of the ESD pulse or the EMC interference signal. In comparison to circuit 1 shown in FIG. 1, this means a permissible rise time of the power-on useful signal that is faster by a factor of 10 when the useful circuit is being switched on. This improvement simultaneously makes it possible to improve the design and specifications of the product's useful circuit.

Figure 3:
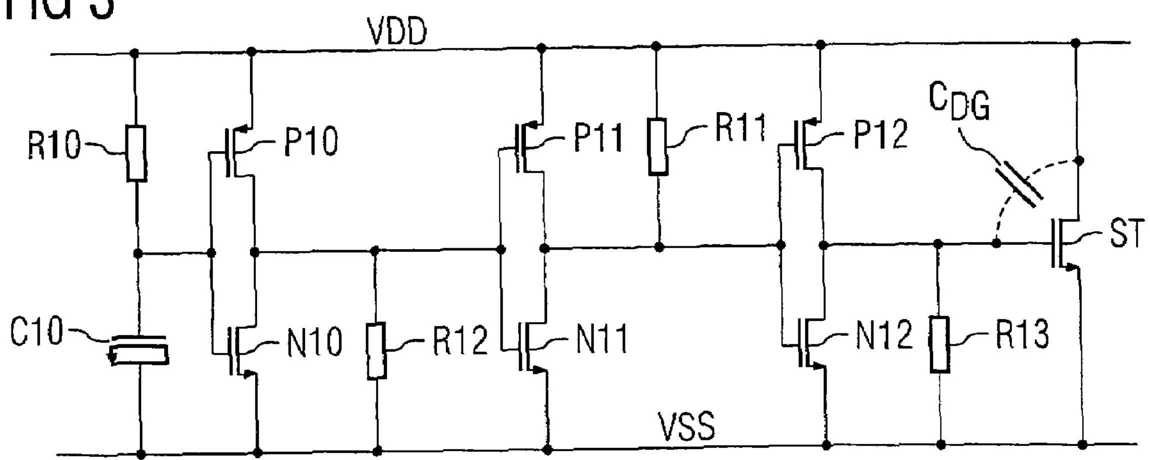
FIG. 3 shows the protection circuit arrangement as shown in FIG. 2 having CMOS inverters.

According to the particular embodiment shown in FIG. 3, the inverters are in the form of CMOS inverters each having a p-channel transistor and an n-channel transistor. The p-channel transistor P10, together with the n-channel transistor N10, forms the first inverter. A corresponding situation applies to the inverter comprising P11 and N1 and that comprising P12 and N12. As in FIG. 2, the resistors R11 to R13 may preferably be in the form of diffusion resistances.

Switching-on of the CMOS inverters is essentially determined by the threshold value of the respective transistor pairing. In the case of CMOS inverters, this threshold value is typically half of the supply voltage and is thus comparatively high. As a result, the circuit is insensitive to fluctuations in the supply such as ripple. Conversely, pronounced ripple interference is needed to switch on the protection transistor.

FIG. 3 depicts the parasitic drain-to-gate capacitance $C_{DG}$ of the protection transistor ST. This capacitance may be used to directly couple interference to the gate of ST. In the case of the exemplary embodiment, the transistor N12 which is in parallel with the resistor R13 (having a typical value of kilohms) and is switched on provides a parallel path which has a low impedance, discharges the interference (at the gate of ST), which is coupled in via $C_{DG}$, to VSS and thus leaves ST switched off.

If the resistors R11 to R13 are in the form of diffusion resistances having a nonlinear voltage/current characteristic, the resistance increases as the current increases. In the case of slow interference and capacitive current coupling, via $C_{DG}$, to the gate of ST, the transistor branch which has a low impedance when switched on has more influence, as the current increases, as a result of N12 and promotes the suppression of interference.

In contrast to slow interference, an interference element may be directly coupled to the gate of the protection transistor ST, in addition to that coupled to the gate of ST via $C_{DG}$, in the case of rapid ESD interference. The transistor N12 which first of all still has a low impedance can then no longer stabilize the gate of ST and keep it at VSS before the inverter comprising P12 and N12 changes over. However, this is favorable because the transistor ST is effectively biased, as a result of this parasitic effect, before it is activated by the ESD detection of the drive circuit which is used to change over the inverters. Therefore, the use of diffusion resistances accelerates and additionally improves the effect of the protection circuit.

In the case of power-on, the circuit arrangement as shown in FIG. 2 and, in particular, as shown in FIG. 3 has the advantage that, from the beginning of power-on, the resistors R11 to R13, together with the inverters, provide defined "off" states which keep the transistor ST switched off. This makes it possible to avoid oscillation caused by a rapidly switching transistor ST, as is possible in known circuits as a result of undefined states. According to FIG. 3, this makes it possible to effect more rapid power-on and permits extended use of the switching device.

The invention claimed is:

1. A circuit arrangement comprising:

a resistive-capacitive (RC) element connected between a first supply potential line and a second supply potential line, the RC element including:
 a first resistor; and
 a first capacitor;

a plurality of inverters connected in series and having junction points between inverters in the plurality of inverters, an input of said plurality of inverters being connected to a point between the first resistor and the first capacitor, a protection transistor having a control input, a first input, and a first output, wherein the control input is connected to the output of the plurality of inverters at a junction point, the first input is connected to the first supply potential line, and the first output is connected to the second supply potential line, and a plurality of resistors, a first input of each of the resistors being connected to a different one of the junction points between the plurality of inverters and the junction point between the inverters and the protection transistor, and a second input of each of the resistors being connected to one of the first supply potential line and the second supply potential line.

2. The circuit arrangement of claim 1, wherein the resistors are alternately connected to the first supply potential line and the second supply potential line.

3. The circuit arrangement of claim 1, wherein an input of a last inverter in the plurality of inverters is connected to one of the first supply potential line and the second supply potential line by a first resistor of the plurality of resistors, and an output of the last inverter is connected to the other of the first supply potential line and the second supply potential line by a second resistor of the plurality of resistors and the output of the last inverter is connected to the control input of the protection transistor.

4. The circuit arrangement of claim 1, wherein the inverters comprise CMOS inverters.

5. The circuit arrangement of claim 1, wherein the resistors comprise diffusion resistances.

6. The circuit arrangement of claim 1, wherein the first resistor comprises a diffusion resistance.

7. The circuit arrangement of claim 1, wherein the capacitance comprises an oxide capacitance.

8. The circuit arrangement of claim 1, wherein the circuit arrangement is configured to protect integrated semiconductor circuits from electrical pulses or electrical overvoltages.

9. A circuit arrangement comprising:

an resistive-capacitive (RC) element connected between a first supply potential line and a second supply potential line, the RC element including:

a first resistor; and a first capacitor;

a first inverter having an input and an output, wherein the input of the first inverter is connected to a first node between the first resistor and the first capacitor;

a second inverter having an input and an output, wherein the input of the second inverter is connected to the output of the first inverter at a second node;

a third inverter having an input and an output, wherein the input of the third inverter is connected to the output of the second inverter at a third node;

a protection transistor having a control input, a first input, and a first output, wherein the control input is connected to the output of the third inverter at a fourth node, wherein the first input of the protection transistor is connected to a first supply potential line, and the first output of the protection transistor is connected to a second supply potential line, and a first resistor connected between the second node and the first supply potential line, a second resistor connected between the third node and the second supply potential line, and a third resistor connected between the fourth node and the first supply potential line.

10. The circuit arrangement of claim 9, wherein the first, second, and third inverters comprise CMOS inverters.

11. The circuit arrangement of claim 9, wherein the resistors are diffusion resistances.

12. The circuit arrangement of claim 9, wherein the first resistor comprises a diffusion resistance.

13. The circuit arrangement of claim 9, wherein the capacitance comprises an oxide capacitance.

* * * * *